United States Patent [19]

Lasar

[11] 4,326,179
[45] Apr. 20, 1982

[54] ELECTRICAL POWER LINE TRANSIENT NOISE FILTERING DEVICE

[76] Inventor: Theodore Lasar, 40 First Ave., New York, N.Y. 10009

[21] Appl. No.: 178,303

[22] Filed: Aug. 15, 1980

[51] Int. Cl.³ .......................... H03H 7/09; H03H 7/24
[52] U.S. Cl. ....................................... 333/177; 333/12; 333/181
[58] Field of Search ........ 333/167, 172, 177, 181–185, 333/12, 81 R, 81 A, 236, 243, 245

[56] References Cited

U.S. PATENT DOCUMENTS

| 3,109,983 | 11/1963 | Cooper et al. | 333/172 X |
| 3,542,654 | 11/1970 | Orr | 204/15 |
| 4,301,428 | 11/1981 | Mayer | 333/12 |

Primary Examiner—Marvin L. Nussbaum

[57] ABSTRACT

An electrical power line transient noise filtering device is disclosed in the specification and drawings comprising a step up transformer connected to two continuous resistors. The high voltage winding of a step down transformer is connected to the other ends of the resistors. Low frequency power passes easily through the system but noise pulses are effectively blocked because they must pass through a transmission line of high loss.

1 Claim, 2 Drawing Figures

ELECTRICAL POWER LINE TRANSIENT NOISE FILTERING DEVICE

SUMMARY OF INVENTION

This invention relates to a device which filters transient electrical noise pulses from the electrical power supply line to sensitive electronic equipment and thus prevents the noise pulses from entering the equipment and causing false operation.

Sensitive electronic equipment such as data processing machines and the like normally derive their power from commercial power lines to which they are connected. Within the data processing machine there is usually a transformer which reduces the power line voltage and a power supply circuit which converts the reduced alternating voltage to direct voltage for use with the solid state circuitry of the machine.

Usually, in addition to the normal voltage supplied by the power companies, there are also present on the power lines a great variety of pulses caused by the making and breaking of highly inductive circuits such as motors, transformers, relays, etc. In addition there can be pulses due to lightning. The worst of these pulses are characterized by very large amplitudes and very fast rise times.

These pulses enter the data processing machine transformer. They are coupled from the primary to the secondary of the transformer and from there they travel along the power supply wiring to the sensitive gates of the switching devices creating false operation.

Many commercial devices are available whose purpose is to prevent these pulses from getting into the sensitive electronic machines. These devices are usually inserted between the power line and the electronic device to be protected. They act by either attenuating the pulses or blocking them by shielding.

The attenuating type of filter is constructed of capacitors and inductances, the inductances being in series with the lines and the capacitors connected in shunt to ground. The inductances act to block the pulses and the capacitors act to shunt the pulses into the ground. The shielding types consist of transformers in which the primary and secondary are shielded from each other by grounded electrostatic shields so that pulses cannot couple from primary to secondary capacitively as they ordinarily would do.

Experience shows that filters constructed along these lines are only partially successful. The electrical noise pulses generated in the huge inductive devices commonly found in factories everywhere have components of frequency that range into the microwave region of a fraction of a centimeter wavelength. Such waves cannot be effectively impeded by inductances. They travel over metallic surfaces in accordance with the principles of wave guides. For these waves there do not exist "grounds" into which they can be "by-passed". The "ground" is merely another metallic surface along which they can travel.

The general object of the invention is to provide a simple filter which will over come the foregoing objections, offer a relatively low attenuation to the power line frequency and a theoretically guaranteed attenuation to the high frequency noise pulses, always increasing as the noise pulse frequency increases.

Another object of the invention is to provide a transient noise filter which can be constructed with sufficient separation between input and output so that radiation from input to output will not by-pass the filter.

Another object of the invention is to provide a filter that actually converts the pulse energy into heat energy and so insures its disappearance.

Another object of the invention is to provide a filter that requires no grounds that the user must supply, which all other types require.

These and other objectives of the invention are achieved by a filter comprising two transformers, one step-up and one step-down, separated by at least several feet and not near any metallic surfaces. The high voltage windings of the transformers are connected together by lineal, continuous resistors, rigidly mounted. The noisy input line is connected to the low voltage winding of the transformer and the noise reduced output is taken from the low voltage winding of the other transformer. As an option, the attenuation to noise may be increased by packing material of high dielectric constant around the lineal resistors.

A significant advantage of the invention is the fact that there exists no metallic path over which pulses can be guided as in the case with all other types.

Another advantage is the fact that the resistive elements can be made as long as necessary thus creating attenuations to pulses as drastic as necessary.

Another advantage of the invention is the fact that the absorption of the pulse energy is guaranteed by the resistive nature of the filter element whereas in all other types there is no such absorbing resistor and the pulse reflects in an unknown and unspecified way.

These and other advantages of the invention, together with additional objects and features will be apparent from the following detailed description and specifications of the invention made in connection with the accompanying drawings.

FIGURES OF THE DRAWING

DETAILED DESCRIPTION AND SPECIFICATION OF THE INVENTION

Figure 1:
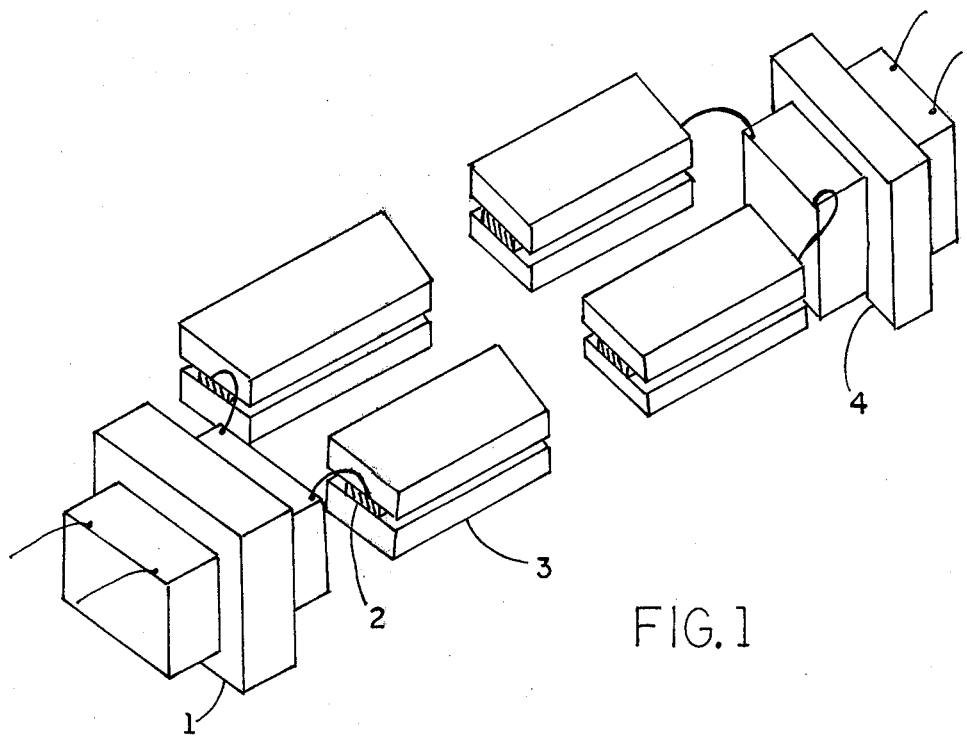
FIG. 1 is a view of the filter to remove transient noise pulses from a supply line showing the transformers and the preferred embodiment of the lineal strips and dielectric material around them.
Figure 2:
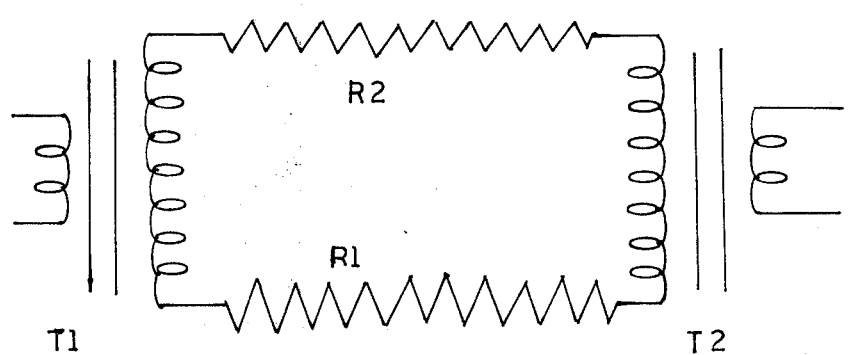
FIG. 2 is a schematic circuit of the filter.

Referring to the transient noise filter shown in FIGS. 1 and 2, the input transformer to which the input power is connected is shown as 1. The lineal resistive strips 2 are connected to the high voltage secondary of input power transformer 1. The resistive strips 2 are sandwiched between blocks of dielectric material 3. At the output end the strips of resistive material 2 are connected to the output transformer 4 at the high voltage side. From the low voltage side of the output transformer 4, power is delivered to the data processing machine or other sensitive electronic device.

In the schematic circuit FIG. 2 the input transformer T1 is connected to resistive strips R2 and R3 which are connected to the output transformer T2.

Details of a practical embodiment are as follows:
Transformers T1 and T2: Primary 120 V; Secondary 24,000 V; Power rating: 1 KVA; Efficiency 95%
Resistors R2 and R1: 2500 ohms each achievable by coating 4"×3' vulcanized fiber with conducting latex paint.

Dielectric 3: Phenolic 5" wide ×1" thick ×3' long.

Typically phenolic has a dielectric constant of about 4.

Line voltage is connected to the primary of transformer T1 and stepped up to 12,000 volts approximately. At the other end of resistors R1 and R2 the voltage is stepped down to approximately 120 V by transformer T2.

If the power delivered were approximately 1 KW the output current would be about 9 amperes. The efficiency of the two transformers would be about 0.95×0.95=0.90 or approximately 90%. This means that about 50 watts would be dissipated in each transformer.

The turns ratio is 24,000/120=200. Therefore the secondary current of transformer T1 is 9/200=0.045 amperes. The power loss in the resistors R1 and R2 is approximately 0.045×0.045×5000=10.1 watts. Thus the overall efficiency is about 890/1000 or about 89%.

The only way that noise pulses can reach the output of the filter is for them to pass through a transmission line 3 feet long of resistance 2500 ohms. From the calculations above it can be seen that this resistance can be made even higher with only a slight degradation of power efficiency. Experience has shown that a distributed transmission line of such orders of resistance and dimensions constitute an impassable barrier to the vast majority of such noise pulses and that a novel and useful filter of maximum effectiveness has been created.

What is claimed is:

1. A filter for attenuating transient noise pulses in the supply line for sensitive electronic equipment consisting of:
    (a) a step up transformer to which the input power line is connected;
    (b) two continuous strips of resistive material each connected to one end of the high voltage secondary of said transformer;
    (c) material of dielectric constant exceeding that of air enclosing the said resistive strips; and
    (d) a step down transformer mounted as far as possible from the first transformer to the high voltage winding of which the two resistive strips are connected and from the low voltage winding of which power is taken for the sensitive electronic equipment.

* * * * *